United States Patent
Adolfsson et al.

(10) Patent No.: US 7,126,348 B2
(45) Date of Patent: Oct. 24, 2006

(54) METHOD AND A DEVICE FOR VOLTAGE MEASUREMENT IN A HIGH-VOLTAGE CONDUCTOR

(75) Inventors: Morgan Adolfsson, Ludvika (SE); Jan Lundquist, Ludvika (SE); Jürgen Häfner, Ludvika (SE)

(73) Assignee: ABB AB, Västerås (SE)

( * ) Notice: Subject to any disclaimer, the term of this patent is extended or adjusted under 35 U.S.C. 154(b) by 0 days.

(21) Appl. No.: 10/539,278

(22) PCT Filed: Dec. 18, 2003

(86) PCT No.: PCT/SE03/02023

§ 371 (c)(1),
(2), (4) Date: Feb. 2, 2006

(87) PCT Pub. No.: WO2004/057346

PCT Pub. Date: Jul. 8, 2004

(65) Prior Publication Data

US 2006/0170432 A1    Aug. 3, 2006

(30) Foreign Application Priority Data

Dec. 20, 2002   (SE) ................... 0203861

(51) Int. Cl.
*G01R 27/08* (2006.01)
*G01R 19/00* (2006.01)
(52) U.S. Cl. ............ 324/658; 324/76.11; 324/713
(58) Field of Classification Search ............ 324/658, 324/713, 76.11
See application file for complete search history.

(56) References Cited

U.S. PATENT DOCUMENTS

| 2,333,532 | A | * | 11/1943 | Frakes et al. ............ 324/552 |
| 3,818,336 | A | | 6/1974 | Marshall |
| 3,842,344 | A | | 10/1974 | Povey |
| 4,204,152 | A | | 5/1980 | Imrie |
| 4,241,373 | A | | 12/1980 | Mara et al. |
| 4,280,093 | A | * | 7/1981 | Houston ............ 324/117 R |
| 4,295,094 | A | | 10/1981 | Wilreker et al. |
| 4,859,925 | A | * | 8/1989 | Beling ............ 324/96 |
| 4,894,609 | A | * | 1/1990 | Fujiki et al. ............ 324/142 |
| 4,999,569 | A | * | 3/1991 | Weikel ............ 324/142 |

FOREIGN PATENT DOCUMENTS

| DE | 10012068 A1 | 10/2001 |
| FR | 2746925 A1 | 10/1997 |

OTHER PUBLICATIONS

A. Adolfsson et al.; EHV Series Capacitor Banks, A New Approach to Platform to Ground Signalling, Reply Protection and Supervisor; IEEE Transactions on Power Delivery; Apr. 1989; pp. 1369-1378; vol. 4, No. 2.

* cited by examiner

*Primary Examiner*—Anjan Deb
*Assistant Examiner*—Timothy J Dole
(74) *Attorney, Agent, or Firm*—Venable LLP; Eric J. Franklin

(57) ABSTRACT

Measuring equipment for forming a measured value for voltage representing an ac voltage on a high-voltage conductor. The measuring equipment includes capacitor equipment with a known capacitance for connection between the high-voltage conductor and ground potential. The measuring equipment further includes a current-measurer for sensing a capacitor current flowing through the capacitor equipment and for forming the measured value for voltage in dependence on the capacitor current.

14 Claims, 4 Drawing Sheets

METHOD AND A DEVICE FOR VOLTAGE MEASUREMENT IN A HIGH-VOLTAGE CONDUCTOR

TECHNICAL FIELD

The present invention relates to measuring equipment and to a method for sensing a voltage in a high-voltage conductor.

It is to be understood that the term measurement value transformer in the following text means a unit that converts a measurement signal from one transmission medium to another, in this case between an analog electrical signal and an optical signal.

BACKGROUND ART

In a high-voltage (HV) installation, or an extra-high-voltage (EHV) installation, there is a need to establish magnitudes of electric variables such as, for example, current, voltage, power and energy, and, as in this case, the occurrence of harmonics of current and voltage.

An extra-high-voltage installation or a high-voltage installation means in this application an installation that may typically comprise electrical equipment such as ac machines, transformers, high-voltage capacitors, loads/burdens, lines, cables, busbars, disconnecting switches and breakers, associated measuring devices and actuators, as well as non-linear components such as, for example, converters, etc., which are located within a limited region and are operated in a coordinated way.

In a high-voltage installation, or an extra-high-voltage installation, measured values of current and voltage are usually sensed by means of measuring devices such as, for example, measuring transformers, voltage transformers and current transformers.

Conventional electromagnetic measuring transformers, in particular voltage transformers, are frequency-dependent and hence generally less suitable for measuring harmonics, since the frequency-dependent fault will be great. With the object of reducing the frequency-dependent fault, other types of measuring transformers may advantageously be used.

Measuring transformers such as instrument transformers with optical transmission of measured values/optical measuring transformers are utilized according to the prior art for sensing measured values in high-voltage installations, for example digital/optical voltage transformers and digital/optical current transformers.

According to the prior art, a digital/optical voltage transformer senses the ac voltage in the conductor that is to be measured with measuring equipment comprising a capacitive voltage divider connected between the conductor, the voltage of which is to be measured, and ground potential, the voltage divider comprising capacitor equipment with high-voltage capacitors in series connection and with a further capacitive auxiliary-voltage divider connected to a part of said series connection, the measuring voltage being sensed via said auxiliary-voltage divider. The digital/optical voltage transformer further comprises a digital/optical measurement value transformer that transforms the measuring voltage into an optical signal for optical transmission. The capacitor equipment is arranged in a support insulator.

One known embodiment of a digital/optical current transformer as part of a piece of protective equipment for a high-voltage installation, in this case a series capacitor installation, is disclosed in (M. Adolfsson et al): EHV Series Capacitor Banks, a new approach to platform to ground signalling, relay protection and supervision, IEEE Transactions on Power delivery, Vol. 4, No. 2, April 1989, pp. 1369–1376. The current transformer described therein has a magnetic core surrounding a connection bar, said connection bar being intended for connection into the conductor, the current of which is to be measured. Further, the current transformer comprises a secondary winding with a burden and a digital/optical measurement value transformer that is of the same kind as the digital/optical measurement value transformer belonging to the digital/optical measuring transformer, such as a voltage measuring device.

A further known embodiment of a measuring transformer is a combined digital/optical measuring transformer, comprising, respectively, a separate digital/optical current transformer and a separate digital/optical voltage transformer of the same kind as described above.

FIG. 1 of this patent application shows as a single-line diagram a known embodiment of measuring equipment 3, comprising a combined digital/optical measuring transformer consisting of a digital/optical current transformer 31 and a separate digital/optical voltage transformer 32, respectively, for sensing measured values for current and voltage, respectively, of a high-voltage conductor 1, and control equipment 2. The measuring equipment is comprised in a high-voltage installation. The control equipment is located in a control room.

According to the prior art, the digital/optical current transformer 31 comprises an electromagnetic current transformer and a digital/optical measurement value transformer 333a.

The current transformer has, in a manner known per se, a magnetic core surrounding a connection bar, said bar being connected in a high-voltage conductor 1 which functions as a primary winding. The current transformer further comprises, in a manner known per se, a secondary winding T2 with a burden R2, said secondary winding surrounding said core. An amplitude value Va of a voltage representing the line current I through the high-voltage conductor 1 is sensed over the burden. The amplitude value Va is supplied to the digital/optical measurement value transformer 333a, in which the amplitude value Va is transformed into an optical signal Da. Transmission of the optical signal Da to the control equipment 2 is performed via optical fibres connected between the digital/optical measurement value transformer 333a and the control equipment 2.

The voltage transformer 32 comprises a capacitive voltage divider with capacitor equipment comprising a high-voltage capacitor HC provided with a test tap V that functionally divides the high-voltage capacitor HC into two capacitor units, as well as a capacitive auxiliary-voltage divider HS designed as a series connection comprising a series resistance R1 and two capacitors C1 and C2, and a digital/optical measurement value transformer 333b.

The high-voltage capacitor HC is connected between the high-voltage conductor 1 and ground potential E. Between the test terminal V and ground potential E, the auxiliary-voltage divider HS is connected with the capacitor C2 connected to ground potential E. Across the capacitor C2, an amplitude value Vb for a voltage representing the line voltage U is sensed. The amplitude value Vb is supplied to the digital/optical measurement value transformer 333b, in which the amplitude value Vb is transformed into an optical signal Db. Transmission of the optical signal Db to the control equipment 2 is performed via optical fibres connected between the digital/optical measurement value transformer 333b and the control equipment 2. The optical measurement value transformer 333b is of the same kind as 333a.

A digital/optical voltage transformer comprising an auxiliary-voltage divider entails a complex design, and furthermore the auxiliary-voltage divider requires considerable space.

In addition, the above measurement arrangement requires a test tap, intended for the auxiliary-voltage divider, on the high-voltage capacitor comprised in the measurement arrangement, whereby said test tap requires a costly bushing.

In the physical embodiment of the above-described combined measuring transformer for combined sensing of measured values for current and voltage, the capacitor equipment is mounted in a support insulator and the digital/optical current transformer is mounted on top of the support insulator. The measurement value transformer comprised in the current transformer is connected at high potential in that the chassis of the current transformer is in direct contact with the high-voltage conductor. The input for the measurement signal on the measurement value transformer of the current transformer is connected to the chassis at one point. In similar manner, the digital/optical voltage transformer is connected to ground potential E via the chassis, and the chassis is connected to the input of the measurement signal on the measurement value transformer of the voltage transformer at one point. The support insulator in this case functions as an insulation between the different potential levels of the respective measurement value transformers.

The measured values for current and voltage, respectively, are thus sensed at essentially separate potential levels, which implies that separate measurement arrangements must be utilized, comprising an optoelectronic measurement value transformer and one transmission link for each measurement arrangement, as described above.

Each optoelectronic measurement value transformer entails a considerable material cost but also a cost for installation and commissioning.

By instead connecting the auxiliary-voltage divider of the voltage transformer between the test tap on the high-voltage capacitor and the high-voltage line, a measured value of high potential may be obtained. However, this is an unpractical solution which still requires an extra bushing for an internal test tap with an unchanged cost for installation and commissioning, and which, in addition, entails a new design.

To this is to be added that each component in an installation in principle increases the risk of a fault occurring in the installation.

SUMMARY OF THE INVENTION

The object of the invention is to provide measuring equipment and a method for sensing measured values for ac voltage on a high-voltage conductor.

According to the invention, this is achieved in that measuring equipment forms a measured value for voltage representing an ac voltage on a high-voltage conductor, wherein the measuring equipment comprises a piece of capacitor equipment with a known capacitance for connection between the high-voltage conductor and ground potential, and wherein the measuring equipment further comprises current-measuring means for sensing a capacitor current flowing through the capacitor equipment and means for forming said measured value for voltage in dependence on said capacitor current.

The invention results, inter alia, in the following advantage with respect to prior art: a simpler design with a smaller number of components. To sense an ac voltage at high-voltage level in accordance with the prior art, there are required a space-demanding capacitive auxiliary-voltage divider, connected to an internal test tap, as well as a specially made extra bushing for the test tap on the high-voltage capacitor in the capacitor equipment. A simpler design also entails advantages such as reduced thermal stress, increased short-circuit capacity, and lower cost.

Advantageous further developments of the invention are obtained by the voltage-measuring means comprising a resistor with known resistance for connection in series with the capacitor equipment, whereby the measured value for voltage is formed in dependence on a sensed voltage across the resistor representing the capacitor current, which also contributes to a simpler design compared with measuring equipment designed according to the prior art. In addition, by choosing the capacitor equipment as a coupling capacitor and providing it with an external voltage terminal connected to said resistor, the measured value, representing a current through said coupling capacitor, may be simply sensed via said voltage terminal.

Another advantage of the above embodiment is that the measuring equipment, where necessary, may be calibrated by readily mounting an extra resistor with a known resistance.

A further advantageous development of the invention is obtained in that said voltage-measuring means comprises a digital/optical measurement value transformer, by which the measured value for voltage is transformed into a series of light pulses representing the measured value for voltage, which permits a voltage-independent transmission.

Yet another advantageous development of the invention is obtained by having the capacitor equipment arranged in a support insulator and allowing the measuring equipment to comprise a screen of an electrically conductive material, surrounding the above-mentioned external voltage terminal and being electrically conductively connected to the casing of the support insulator. In this way, capacitive parasitic currents and resistive surface currents may be bypassed the external voltage terminal of the coupling capacitor in a defined way.

The above-mentioned conductive material is advantageously any of the following materials: metal, conductive polymer material, conductive composite material.

Still another advantageous development of the invention is to allow measuring equipment according to the invention, with said resistor connected between the high-voltage conductor and the capacitor equipment, to comprise also a current-measuring means such as a current transformer with a magnetic core, which current transformer is utilized for forming a measured value for current representing a line current that flows through the high-voltage conductor, and to allow said measured value for current to be supplied to a digital/optical measurement value transformer and to transform the measured value for current into a series of light pulses, representing the measured value for current, for a voltage-independent transmission.

A further advantageous development of the invention is to allow measuring equipment according to the invention also to comprise a current-measuring means, such as a Rogowski coil, for forming a current-measuring value representing a line current that flows through the high-voltage conductor, said current-measuring value being treated in the same way as has been described above for the current-measuring value formed from the measured value from a current transformer. Because of the non-metallic core that is characteristic of a Rogowski coil, the core will not become magnetically saturated. The resultant output voltage from a Rogowski coil increases proportionally with the frequency and is thus advantageous when detecting harmonics with low amplitude. A current transformer is provided with an iron core and has, by way of comparison, a magnetization curve with a non-linear characteristic. With an embodiment with a Rogowski coil as current-measuring means, a simpler design, with respect to weight and cost, is also obtained.

An additional advantageous development of the invention is to allow measuring equipment according to the invention to also comprise current-measuring means, such as a combination of a current transformer and a Rogowski coil. The fundamental component is measured with the current transformer and higher-order components are measured with the Rogowski coil for the purpose of thus obtaining a good accuracy of measurement over a larger frequency interval than for each current-measuring means separately.

Another advantageous development of the invention is to allow measuring equipment to comprise voltage-measuring means according to the invention, current-measuring means comprising a Rogowski coil and/or a current transformer as well as a digital/optical measurement value transformer, said measurement value transformer being arranged to sequentially transform both measured values for voltage and measured values for current into series of light pulses for sequential transmission, and at the same time supply said digital/optical measurement value transformer with both measured values for voltage and measured values for current, and to sequentially transform said measured value for voltage and said measured value for current into series of light pulses for sequential transmission to ground potential on a common optical transmission link.

One advantageous embodiment of the above-mentioned measuring equipment is to arrange the capacitor equipment in a support insulator and with said current-measuring means with said digital/optical measurement value transformer mounted on the top of the support insulator, and with the electrically conductive screen connected both to an electrically conductive part, for example a metallic part, on the current-measuring means, and to the casing of the support insulator but electrically insulated from the external voltage terminal of the coupling capacitor.

Advantageous further developments of the invention will be clear from the following description and the appended claims.

BRIEF DESCRIPTION OF THE DRAWINGS

The invention will be described in greater detail by description of embodiments with reference to the accompanying drawings, wherein.

DESCRIPTION OF THE PREFERRED EMBODIMENTS

Figure 1:
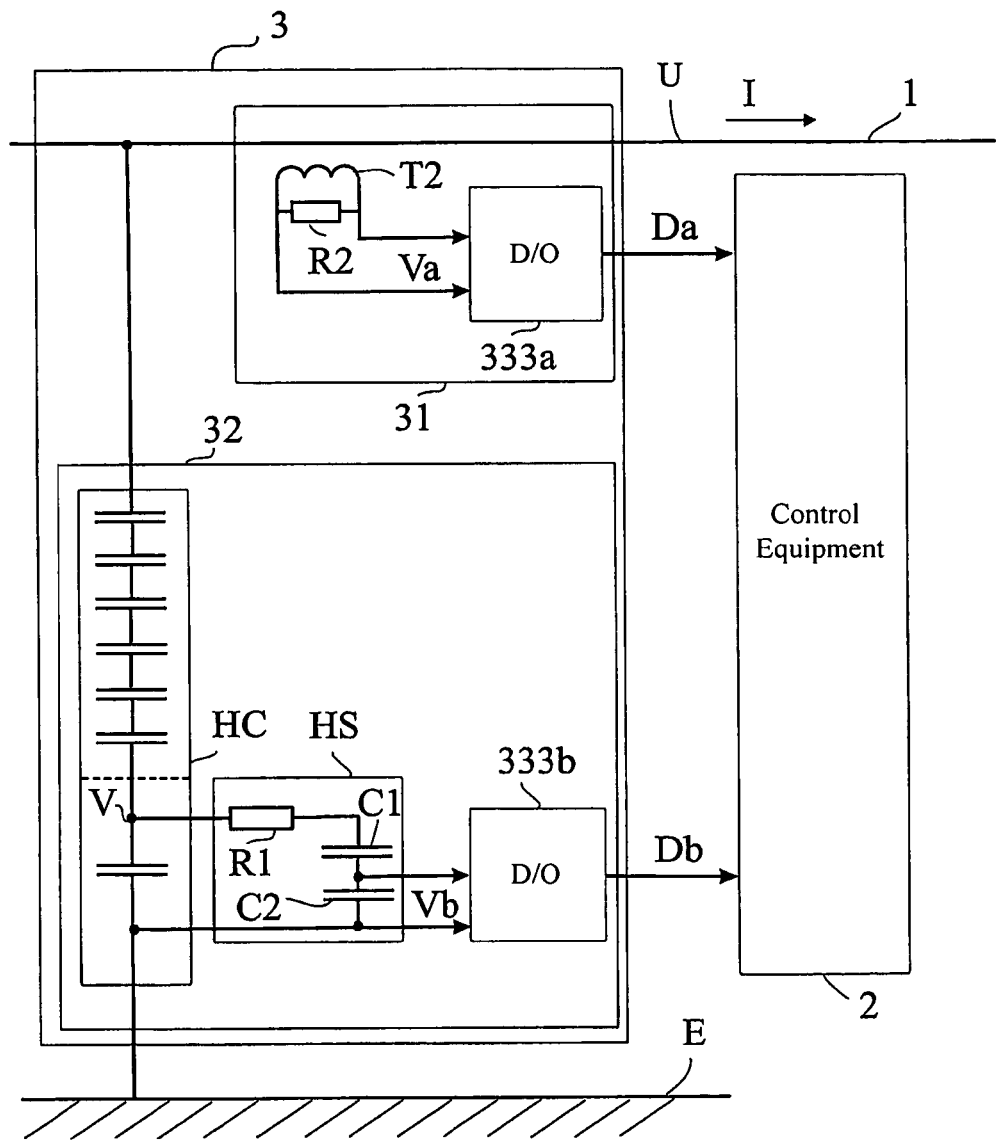
FIG. 1 shows an embodiment according to the prior art of measuring equipment for current and voltage measurement in a high-voltage installation.
Figure 2A:
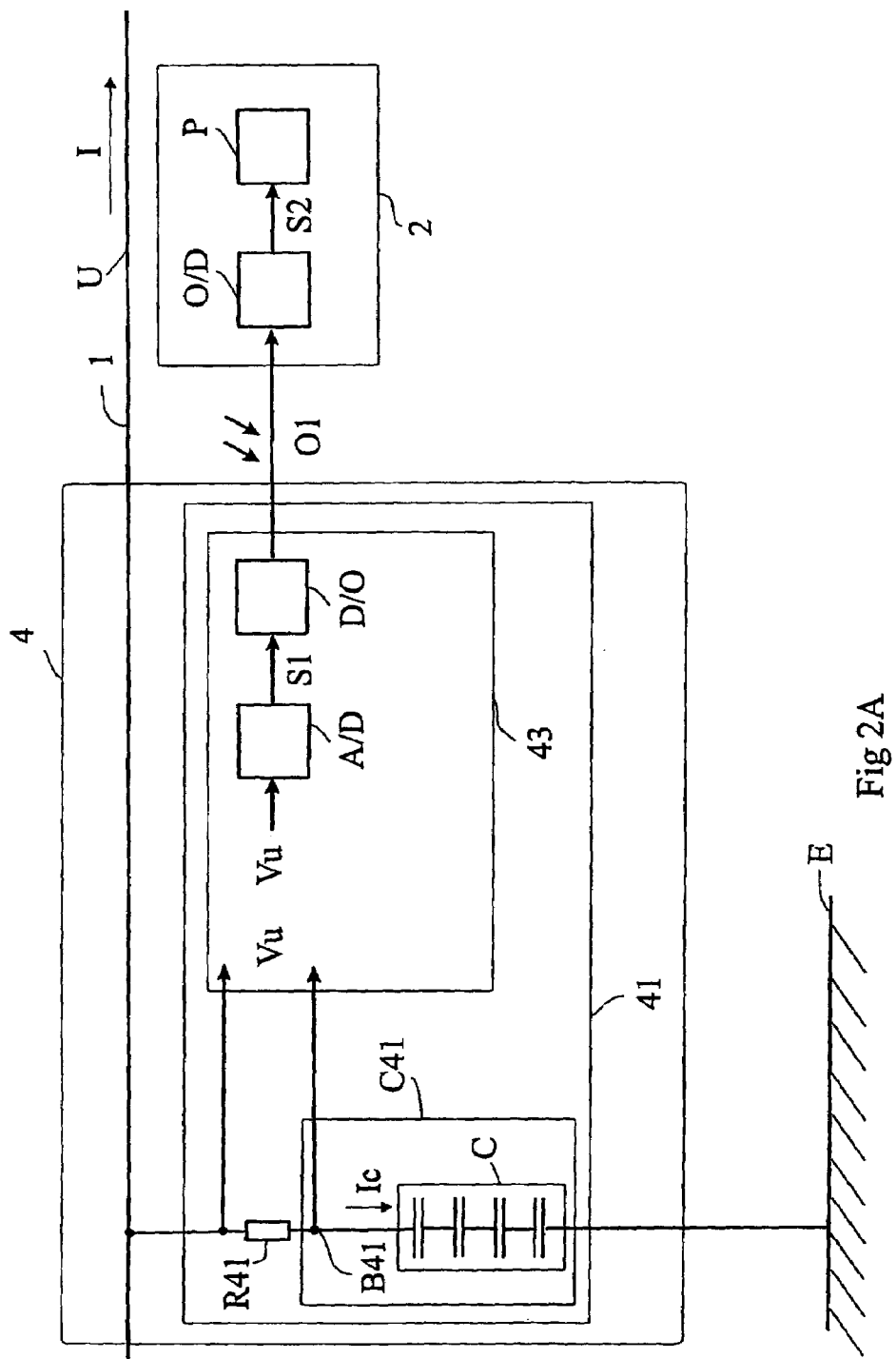
FIG. 2A shows an advantageous embodiment of measuring equipment in a high-voltage installation for voltage measurement according to the invention.

The following description relates to the method as well as the measuring equipment FIG. 2A shows, in the form of a single-line diagram and a block diagram, measuring equipment 4 for sensing a voltage by a voltage-measuring means 41 for the purpose of forming measured values representing voltage on a high-voltage conductor 1, and control equipment 2. The measuring equipment is comprised in a high-voltage installation. The control equipment is placed in a control room.

Typical values of the high-voltage conductor 1 are 200–4000 A and 145–550 kV.

The voltage-measuring means 41 comprises a resistor R41, a digital/optical measurement value transformer 43, and capacitor equipment C41 comprising a coupling capacitor C with an external voltage terminal B41.

The resistor R41 is connected between the high-voltage conductor 1, at high-voltage level, and the external voltage terminal B41 on the capacitor equipment, the second pole of which is connected to ground potential E. Across the resistor R41, the measured value Vu is sensed in the form of a voltage representing the current Ic through the coupling capacitor C, the current Ic for a given frequency being proportional to the ac voltage U between the high-voltage conductor 1 and ground potential E. The measured value Vu is supplied to the digital/optical measurement value transformer 43.

The digital/optoelectronic measurement value transformer 43 comprises, in a known manner, conversion equipment comprising an analog/digital converter A/D and a digital/optical converter D/O. The measurement value transformer has a number of input channels, each channel being intended for a continuous analog input signal and being provided with a freely configurable processor unit for signal-processing of said input signal, as well as a common output channel.

The control equipment comprises similar conversion equipment, comprising an optical/digital converter O/D. In addition thereto, the conversion equipment also comprises a calculating member P, for example computer equipment comprising a processor unit, intended for processing of measured data in a computer program or as a computer program code element. Signal processing and further processing in the control equipment 2 are performed at ground potential.

The digital/optical converter D/O and the optical/digital converter O/D are connected to optical fibres for transmission of an optical signal, such as an optical transmission link.

The analog signal Vu from the voltage-measuring means occurs on one of the input channels of the measurement value transformer, said analog signal being further supplied to the analog/digital converter A/D which converts said analog signal into a digital electronic signal S1 representing the signal Vu.

The signal S1 is supplied to the digital/optical converter D/O of the measurement value transformer, which converts the digital electronic signal S1 into an optical digital output signal O1. The transmission of the optical signal O1 to the control equipment 2 is performed via said optical fibres connected between the digital/optical measurement value transformer 43 and the control equipment 2. The optical digital signal O1 is converted in the optical/digital converter in the control equipment into a digital signal S2 representing the measured value Vu of a voltage representing the current Ic through the coupling capacitor C.

The digital signal S2 is thereafter supplied to the calculating member. In an interface, created for this purpose, in the calculating member there is performed, in dependence on the digital signal S2, a calculation of the ac voltage U between the high-voltage conductor 1 and ground potential E. The calculation is carried out with the measured value of the current Ic as a parameter and with known values of the resistance of the resistor R41 and the impedance of the coupling capacitor C. As mentioned above, the current Ic for a given frequency is proportional to the ac voltage U between the high-voltage conductor 1 and ground potential E. The digital signal S2 is allowed to be directly processed in an interface, created for the purpose, in the calculating member for the purpose of determining a measure of the harmonic content or the power output.

Typical values for the coupling capacitor and the resistor in the embodiment described are, with the voltage 145–550 kV and the frequency 50 Hz, for the coupling capacitor 19–5 nF or lower with corresponding impedance values 640–165 kΩ, and for the resistor 1–20Ω.

Figure 2B:
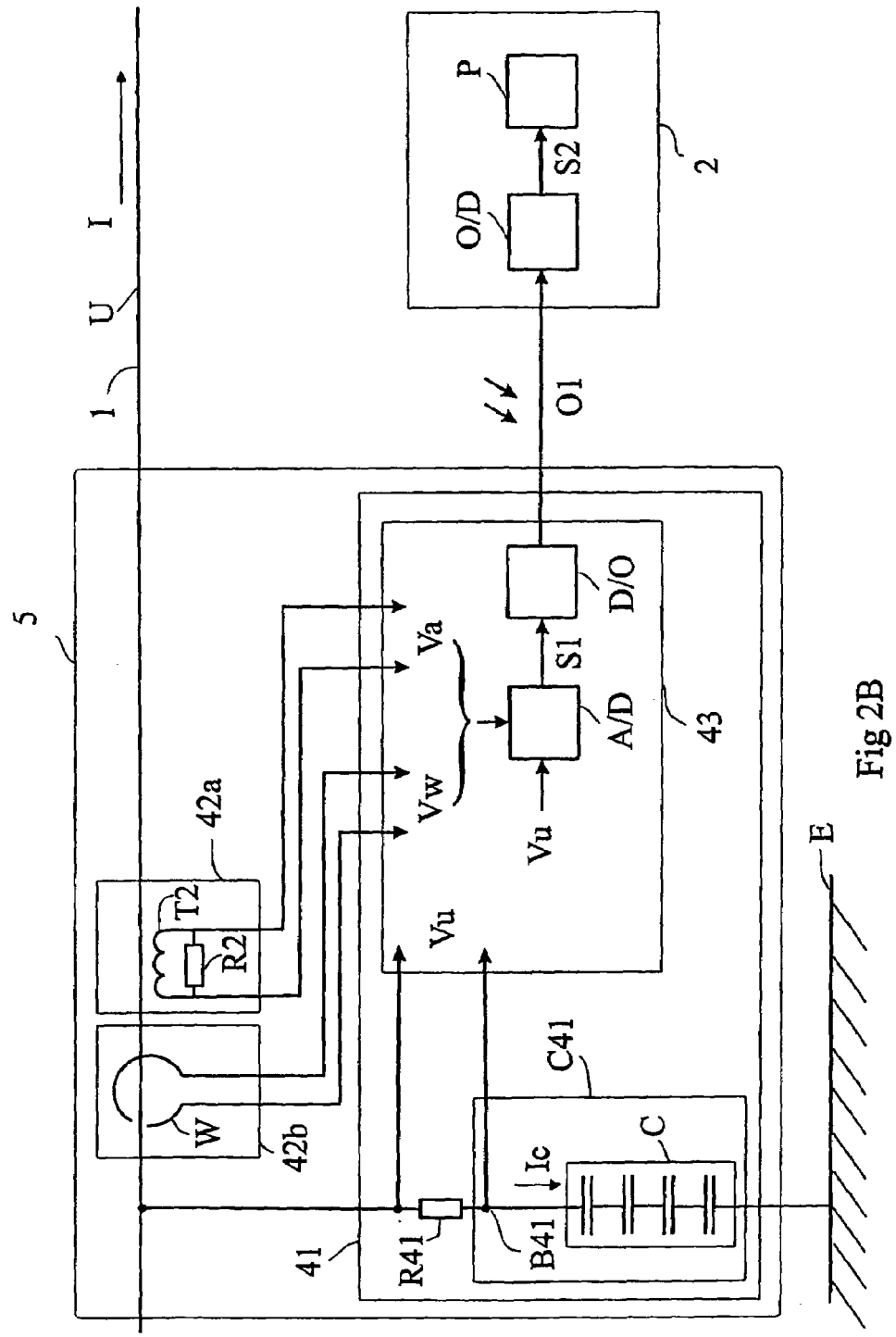
FIG. 2B shows an advantageous embodiment of measuring equipment in a high-voltage installation for voltage measurement according to the invention combined with current measurement according to the prior art.

Another advantageous embodiment of the invention is shown in FIG. 2B, comprising measuring equipment 5 for sensing current and voltage for the purpose of forming measured values representing current and voltage on a high-voltage conductor 1, and control equipment 2.

The measuring equipment 5 comprises a voltage-measuring means 41 with the design as described above, and a current-measuring means with different designs according to the prior art, for example comprising a current transformer, here designated the first embodiment 42a, or comprising a Rogowski coil, here designated the second embodiment 42b.

In the voltage-measuring means, the measured value Vu is sensed in the form of a voltage representing the current Ic through the coupling capacitor C as described above, which current Ic for a given frequency is proportional to the ac voltage U between the high-voltage conductor 1 and ground potential E. The measured value Vu is supplied to a first channel of the digital/optical measurement value transformer 43.

In the current-measuring means in the first embodiment 42a, comprising a current transformer, the current transformer has, in a known manner, a magnetic core with a connection bar passed through the measuring core, the connection bar being connected to the high-voltage conductor which in this way functions as a primary winding, and a secondary winding T2 wound around the measuring core surrounding said connection bar. The current transformer further comprises, in a known manner, a burden in the form of a resistor R2. Across the burden a measured value Va is sensed in the form of a voltage representing the line current I through the high-voltage conductor. The measured value Va is supplied to a second channel of the digital/optical measurement value transformer 43.

In the current-measuring means 42b comprising a Rogowski coil W, the Rogowski coil surrounds the high-voltage conductor 1 in a known manner. The Rogowski coil is used to sense a measured value Vw in the form of a voltage representing the line current I through the high-voltage conductor. The measured value Vw is supplied to a second channel of the digital/optical measurement value transformer 43.

On the input channels of the digital/optoelectronic measurement value transformer 43, there occur the analog signals Va or Vw from the current-measuring means and Vu from the voltage-measuring means. The input channels of the measurement value transformer are connected to the analog/digital converter A/D. The analog/digital converter A/D may, for example, consist of a single analog/digital converter unit or several analog/digital converter units, one unit being connected to each of said input channels.

If the analog/digital converter A/D consists of a single analog/digital unit, this unit senses said input channels sequentially by means of a time multiplexer with a sampling frequency obtained from the control equipment 2 and then converts the sensed analog signals on the input channels into a sequential digital electronic signal S1 representing both the signal Vu and the signal Va, alternatively Vw.

If the analog/digital converter A/D consists of several analog/digital converter units, each one of the units at the same instant senses the input channel connected to said unit. The analog signals sensed on the input channels are then converted, in the same way as described above, sequentially by means of a time multiplexer with a sampling frequency obtained from the control equipment 2 into a sequential digital electronic signal S1 representing both the signal Vu and the signal Va, alternatively Vw.

Thereafter, the signal S1 is supplied to the digital/optical converter D/O which converts the digital electronic signal S1 into an optical digital output signal O1 for further transmission to the control equipment in the same way as described above for the voltage-measuring means.

The optical digital signal O1 is then converted in the control equipment into a digital signal S2, sequentially representing the signals Va or Vw from the current-measuring means, and the signal Vu from the voltage-measuring means.

In an interface created for this purpose in the calculating member, the digital signal S2 is divided sequentially, with the given sampling frequency as parameter, into its constituents, the signals Va or Vw, representing the line current I, and Vu representing a measured value for voltage representing the current Ic through the coupling capacitor C, and in another interface created for this purpose, a calculation of the ac voltage U is performed, with the measured value of the current Ic as parameter and with known values of the resistance of the resistor R41 and the impedance of the coupling capacitor C. As mentioned above, the current Ic for a given frequency is proportional to the ac voltage U between the high-voltage conductor 1 and ground potential E. The constituents of the digital signal also allow themselves to be directly processed in another interface created for this purpose for determining a measure of the harmonic content or power output.

Still another advantageous embodiment of the invention is to allow measuring equipment to comprise a voltage-measuring means 41, which performs voltage measurement according to the invention in the manner described above, and at the same time a current-measuring means which also at the same time utilizes both the first embodiment 42a, comprising a measuring transformer, and the second embodiment 42B, comprising a Rogowski coil which performs current measurement according to known technique in the manner described above (see FIG. 2B). The object is to obtain a good accuracy of measurement also for a frequency interval comprising higher-order components. The sensed measured values for voltage, Vu, Vw and Va, are supplied in this embodiment to three different channels on the digital/optical measurement value transformer 43 and are further processed in the same way as described above for measured values supplied to the digital/optical measurement value transformer upon combined current and voltage measurement, with the difference that the digital signal S1 and the optical signal O1 and the digital signal S2 sequentially represent all the signals Vu, Va and Vw. Va and Vw represent the line current I, the fundamental component of the current measured with the current transformer and the higher-order components measured with the Rogowski coil, for the purpose of thus obtaining a good accuracy of measurement over a larger frequency interval than for each current-measuring means separately. Vu represents a measured value for voltage representing the current Ic through the coupling capacitor C and the current Ic for a given frequency is, as mentioned above, proportional to the ac voltage U between the high-voltage conductor 1 and ground potential E.

Figure 3:
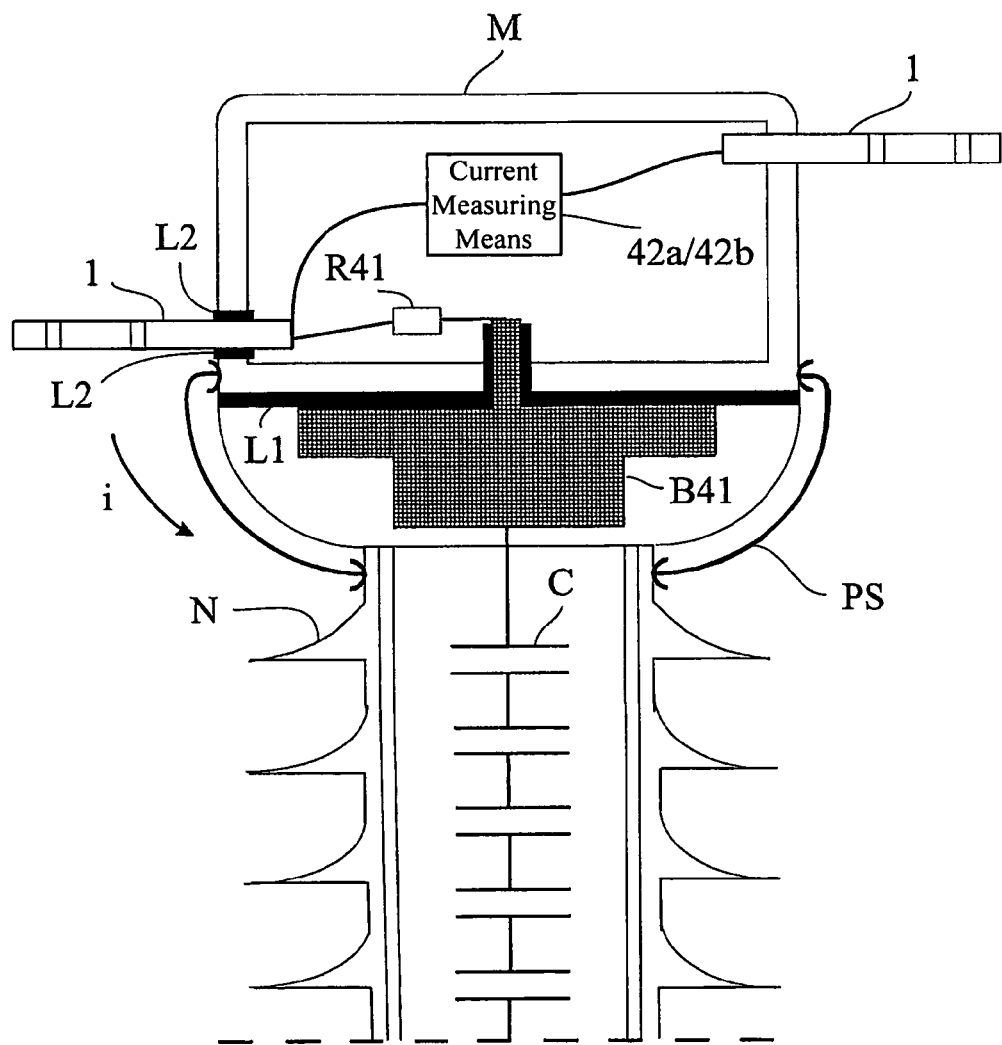
FIG. 3 shows an advantageous embodiment of a physical design of measuring equipment in a high-voltage installation for voltage measurement according to the invention combined with current measurement according to the prior art, the measuring equipment comprising a screen as electrical and electromagnetic protective equipment.

FIG. 3 shows a physical embodiment of the measuring equipment, described above and shown in FIG. 2B, for a combined sensing of measured values for current and voltage, while utilizing the current-measuring means according to the first embodiment 42a, comprising a measuring transformer, and/or while utilizing the current-measuring means according to the second embodiment 42b, comprising a Rogowski coil, and the voltage-measuring means in the embodiment according to the invention. In said physical embodiment of the measuring equipment, the capacitor equipment is comprised in a support insulator N, and the current-measuring means is advantageously placed on top of the support insulator, the resistor R41 being connected between the high-voltage conductor 1 and the external voltage terminal B41 of the coupling capacitor C at high-voltage level. The external voltage terminal is separated from the electrically conductive casing M of the current-measuring means by an insulating layer L1, and the high-voltage conductor is separated from the electrically conductive casing M of the current-measuring means by an insulating layer L2.

The measurement signal, which represents the current through the coupling capacitor, is subjected to the influence of capacitive parasitic currents between the high-voltage terminal of the coupling capacitor and adjacent phases, as well as to resistive surface currents on the insulator. These currents affect the magnitude and phase position of the measurement signal.

By providing the measuring equipment according to the invention with a screen PS of an electrically conductive material, for example metal, conductive polymer material or conductive composite material, wherein said screen surrounds the external voltage terminal B41 of the coupling capacitor as an electromagnetic screen, this error source emanating from capacitive and resistive currents i is significantly reduced.

The screen is electrically insulated from the voltage terminal B41. The upper part of the screen is connected to the conductive parts, for example the metallic parts, M of the casing around the current-measuring means at high potential, and the lower part of the screen is connected to the casing N of the insulator with an elastic, conductive material, for example conductive rubber or a resilient material, which establishes a controlled bypass between the casing and the insulator for the resistive surface currents that may arise on the surface of the insulator.

The measuring equipment may be calibrated by connecting high-ohmic known resistors in a parallel connection with the resistor R4 by means of a simple installation.

The invention is not limited to the embodiments shown, but the person skilled in the art may, of course, modify it in a plurality of ways within the scope of the invention as defined by the claims. Thus, the resistor R41 may be simply integrated as part of the current-measuring means.

Additional embodiments are provided by replacing the optical transmission link by a radio link or a transmission link with infrared light (IR).

The digital/optical converter D/O in the measurement value transformer is then replaced by a digital/radio signal converter and the optical/digital converter O/D in the control equipment is replaced by a radio/digital signal converter if the optical link is replaced by a radio link, or the digital/optical converter D/O in the measurement value transformer is replaced by a digital/IR converter and the optical/digital converter O/D in the control equipment is replaced by an IR/digital converter if the optical link is replaced by a transmission link for infrared light.

In the control equipment, the transmitted signal is converted into a suitable form and level and is processed in a suitable way in the same way as described here and as described above with reference to FIGS. 2A and 2B.

With measuring equipment comprising voltage measurement according to the invention, the resistor may also be connected between the coupling capacitor and ground potential

The invention claimed is:

1. Measuring equipment for forming a measured value for voltage representing an ac voltage on a high-voltage conductor, said measuring equipment comprising capacitor equipment with a known capacitance for connection between the high-voltage conductor and ground potential, wherein the capacitor equipment is in the form of a coupling capacitor with an external voltage terminal, wherein the capacitor equipment is arranged in a support insulator, wherein the measuring equipment comprises a screen of an electrically conductive material surrounding said external voltage terminal, and wherein said electrically conductive screen is electrically conductively connected to the casing of the support insulator and wherein the measuring equipment further comprises current-measuring means for sensing a capacitor current flowing through the capacitor equipment and for forming the measured value for voltage in dependence on said capacitor current.

2. The measuring equipment according to claim 1, wherein said current-measuring means comprises a resistor for connection in series with the capacitor equipment, the measured value for voltage being formed in dependence on a sensed voltage across the resistor representing the capacitor current.

3. The measuring equipment according to claim 1, wherein said current-measuring means comprises a digital/optical measurement value transformer for transforming the measured value for voltage into a series of light pulses representing the measured value for voltage.

4. The measuring equipment according to claim 3, wherein said resistor is connected between the high-voltage conductor and said external voltage terminal on the capacitor equipment and wherein, in addition thereto, it comprises current-measuring means for forming a measured value for current representing a line current flowing through the high-voltage conductor.

5. The measuring equipment according to claim 4, wherein the measured value for current is supplied to said digital/optical measurement value transformer for transforming the measured value for current into a series of light pulses representing the measured value for current.

6. The measuring equipment according to claim 5, wherein the digital/optical measurement value transformer is arranged to sequentially transform said measured value for voltage and said measured value for current into series of light pulses for sequential transmission to ground potential on a common optical transmission link.

7. The measuring equipment according to claim 4, wherein said current-measuring means are mounted on the top of said support insulator, and wherein said electrically conductive screen is electrically conductively connected to an electrically conductive part on the current-measuring means that is located at the potential of the high-voltage conductor but is electrically insulated from the external voltage terminal of the coupling capacitor.

8. A method for forming at least one measured value for voltage, representing an ac voltage on a high-voltage conductor, wherein measuring equipment comprising capacitor equipment with a known capacitance is connected between the high-voltage conductor and ground potential, wherein the capacitor equipment is constituted by a coupling capacitor, and wherein the coupling capacitor is provided with an external voltage terminal, and wherein the capacitor equipment is arranged in a support insulator, and wherein said measuring equipment is provided with a screen of an electrically conductive material, surrounding said external voltage terminal and being electrically conductively connected to the casing of the support insulator and wherein a capacitor current flowing through the capacitor equipment is sensed and wherein said measured value for voltage is formed in dependence on said capacitor current.

9. The method according to claim 8, wherein a resistor is connected in series with the high-voltage conductor and the capacitor equipment and wherein said capacitor current is sensed as a measured value for voltage across the resistor.

10. The method according to claim 8, wherein the measured value for voltage is supplied to a digital/optical measurement value transformer and that said the measured value for voltage is transformed into a series of light pulses representing the measured value for voltage.

11. The method according to claim 10, wherein said resistor is connected between the high-voltage conductor and said external voltage terminal on the capacitor equipment, and wherein, in addition thereto, a current measuring means is connected to the measuring equipment, and wherein a measured value far current, representing a line current flowing through the high-voltage conductor, is sensed.

12. The method according to claim 11, wherein the measured value for current is supplied to a digital/optical measurement value transformer, and wherein said measured value for current is transformed into a series of light pulses representing the measured value for current.

13. The method according to claim 12, wherein said measured value for voltage and said measured value for current are transmitted sequentially to ground potential on a common optical transmission link.

14. The method according to claim 11, wherein said current-measuring means is mounted on the top of said support insulator, and wherein said electrically conductive screen is electrically conductively connected to an electrically conductive part on the current-measuring means that is located at the potential of the high-voltage conductor but is electrically insulated from the external voltage terminal of the coupling capacitor.

* * * * *